(12) United States Patent
Mizuno et al.

(10) Patent No.: US 7,715,153 B2
(45) Date of Patent: May 11, 2010

(54) MAGNETORESISTIVE EFFECT ELEMENT HAVING INNER AND OUTER PINNED LAYERS INCLUDING A COBALT IRON ALLOY

(75) Inventors: Tomohito Mizuno, Tokyo (JP); Daisuke Miyauchi, Tokyo (JP); Masashi Sano, Tokyo (JP)

(73) Assignee: TDK Corporation, Chuo-ku, Tokyo (JP)

( * ) Notice: Subject to any disclaimer, the term of this patent is extended or adjusted under 35 U.S.C. 154(b) by 944 days.

(21) Appl. No.: 11/218,719

(22) Filed: Sep. 6, 2005

(65) Prior Publication Data
US 2006/0203397 A1    Sep. 14, 2006

(30) Foreign Application Priority Data
Sep. 7, 2004   (JP)   ............... 2004-259777

(51) Int. Cl.
  *G11B 5/33*   (2006.01)
(52) U.S. Cl. ............................. 360/324.11
(58) Field of Classification Search ............ None
  See application file for complete search history.

(56) References Cited

U.S. PATENT DOCUMENTS

| | | | | |
|---|---|---|---|---|
| 6,122,150 | A * | 9/2000 | Gill | 360/324.11 |
| 6,226,159 | B1 | 5/2001 | Pinarbasi | |
| 6,252,750 | B1 * | 6/2001 | Gill | 360/324.11 |
| 6,295,187 | B1 * | 9/2001 | Pinarbasi | 360/324.11 |
| 6,580,588 | B1 * | 6/2003 | Gill | 360/324.1 |
| 6,587,317 | B2 * | 7/2003 | Gill | 360/324.11 |
| 6,621,665 | B1 * | 9/2003 | Gill | 360/324.11 |
| 6,709,767 | B2 * | 3/2004 | Lin et al. | 428/814 |
| 6,780,524 | B2 * | 8/2004 | Lin et al. | 428/814 |
| 6,785,102 | B2 * | 8/2004 | Freitag et al. | 360/324.11 |
| 2002/0024780 | A1 * | 2/2002 | Mao et al. | 360/324.11 |
| 2003/0011463 | A1 | 1/2003 | Iwasaki et al. | |

FOREIGN PATENT DOCUMENTS

| | | |
|---|---|---|
| JP | 2001-52317 | 2/2001 |
| JP | 2003-8103 | 1/2003 |
| JP | 2003-318460 | 11/2003 |
| JP | 2003-324225 | 11/2003 |

OTHER PUBLICATIONS

Japanese Office Action dated Nov. 5, 2008 with a partial English translation.

* cited by examiner

*Primary Examiner*—David D Davis
(74) *Attorney, Agent, or Firm*—McGinn IP Law Group, PLLC

(57) ABSTRACT

A magneto-resistive effect element includes a free layer having a magnetization direction which varies with respect to an external magnetic field; a pinned layer which includes a stacked structure comprising an outer pinned layer which has a magnetization direction that is fixed with respect to the external magnetic field, a non-magnetic intermediate layer which is made of ruthenium with a thickness of about 0.4 nm, and an inner pinned layer with a thickness of 3 nm or more, wherein the inner pinned layer has a magnetization direction which is fixed with respect to the external magnetic field due to anti-ferromagnetic coupling with the outer pinned layer via the non-magnetic intermediate layer; and a spacer layer sandwiched between the free layer and the inner pinned layer. Sense current flows through the pinned layer, the spacer layer, and the free layer substantially in a stacked direction.

16 Claims, 12 Drawing Sheets

| Average Atomic Percent of Co (%) | Exchange Coupling Magnetic Field (A/m) |
|---|---|
| 63 | 108813 |
| 70 | 115500 |
| 74 | 108654 |
| 90 | 34308 |

| Atomic Percent of Co (%) | Exchange Coupling Strength (0.1×µJ/cm2) | |
|---|---|---|
| | Room Temp.(297K) | Operation Temp.(627K) |
| 50 | 1.8 | 1.2 |
| 70 | 3 | 2.1 |
| 90 | 2.7 | 2.3 |
| 100 | 2.7 | 2.2 |

MAGNETORESISTIVE EFFECT ELEMENT HAVING INNER AND OUTER PINNED LAYERS INCLUDING A COBALT IRON ALLOY

BACKGROUND OF THE INVENTION

1. Field of the Invention

The present invention relates to a magneto-resistive effect element, a thin-film magnetic head, a head gimbal assembly, and a hard disk drive, and more particularly, to a magneto-resistive effect element for use in a thin-film magnetic head for a magnetic recording apparatus such as a hard disk drive.

2. Description of the Related Art

Magnetic heads using a GMR (Giant Magneto-resistive) film as a read element have been utilized in a wide range of applications in order to cope with the density of magnetic recording that is increasingly higher. In particular, a GMR element using a spin valve film (hereinafter called an SV film) can provide a magnetic head having a higher sensitivity because of the large change in its resistance to sense current which is applied to the element in order to read recorded data on a recording medium. An SV film consists of stacked films which have a ferromagnetic film whose magnetization direction is fixed in one direction (hereinafter also called a pinned layer), a ferromagnetic film whose magnetization direction varies in response to an external magnetic field generated by a recording medium (hereinafter also called a free layer), and a non-magnetic spacer layer sandwiched therebetween.

Conventionally, a CIP (Current in Plane)—GMR element to which sense current is applied in parallel with film planes has been widely used for a MR element that has an SV film. Recently, a magnetic head which uses a CPP (Current Perpendicular to the Plane)—GMR element to which sense current is applied perpendicular to film planes has been developed in order to cope with a further increase in density. A CPP-GMR element exhibits lower resistance than a TMR (Tunnel Magneto-resistance) element having TMR film, which is an alternative kind of a CPP type element. A CPP-GMR element also exhibits a large output even when it reads data from a track in a narrow width, as compared with a CIP-GMR element. Therefore, the CPP-GMR element is considered to be a highly promising element having a high potential.

However, since the sense current passes perpendicular to the film planes, i.e., boundaries, a CPP-GMR element has the disadvantage that it does not generate sufficient spin dependent scattering on the boundaries, resulting in a small change in the magneto-resistance. Thus, in CPP-GMR elements, the following two measures are generally taken in order to increase the change in the magneto-resistance. One is to increase the number of boundaries to enhance the boundary scattering effect. Since a boundary scattering coefficient depends on a combination of materials which form a boundary, the layer configuration is important. For example, a multi-layer configuration, such as Co/NiFe/Co, in which at least one of two pinned layers has an intermediate layer made of NiFe, is disclosed as an appropriate layer configuration. See, for example, the specification etc. of Japanese Patent Laid-open Publication No. 2003-8103, and No. 2001-52317. The other is to increase the thicknesses of a free layer, a non-magnetic intermediate layer, a pinned layer, etc. in order to increase the scattering of conduction electrons within each layer, i.e., to increase the resistance due to bulk scattering. In this approach, the film thickness is more important than the layer configuration. CPP-GMR elements, indeed, are often made considerably thicker than CIP-GMR elements and TMR elements.

A so-called synthetic pinned layer can be used for the pinned layer of a GMR element. A synthetic pinned layer is a pinned layer that has an outer pinned layer which is a magnetic layer, a non-magnetic metal layer made of Ru or Rh, and an inner pinned layer which is a magnetic layer, stacked in this order, wherein the outer pinned layer and the inner pinned layer are anti-ferromagnetically coupled via the non-magnetic metal layer. In this configuration, the overall SV film is composed of a buffer layer/anti-ferromagnetic layer/outer pinned layer/non-magnetic intermediate layer/inner pinned layer/spacer layer/free layer/cap layer, which are stacked in this order. In a synthetic pinned layer, the outer pinned layer and the inner pinned layer are magnetized anti-parallel to each other, so that the magnetization of the pinned layer is inhibited and stabilized. Further, when the synthetic pinned layer is used in the read element of a head, the shift of a bias point due to a static magnetic field from the pinned layer can be prevented.

While investigations to apply a synthetic pinned layer to a CPP-GMR element have been performed, the film thickness of a pinned layer, i.e., the film thicknesses of an outer pinned layer and an inner pinned layer, tends to be larger by the reason described above.

However, in a CPP-GMR element which uses a synthetic pinned layer, the increase in film thickness of a pinned layer, as described above, creates the disadvantage that it is difficult to ensure the anti-ferromagnetic coupling between the outer pinned layer and the inner pinned layer will occur. This is because the increase in film thickness of the pinned layer causes magnetic moments to be increased in the outer pinned layer and the inner pinned layer. The increase in magnetic moments leads to insufficient degree of strength for the exchange coupling of the non-magnetic intermediate layer, and this means that the anti-ferromagnetic coupling of the outer pinned layer and the inner pinned layer will be weak.

Ideally, in a synthetic pinned layer, an outer pinned layer and an inner pinned layer are configured to be in anti-parallel magnetization directions, and configured to exhibit no effective magnetization as a whole. However, in a thick pinned layer as mentioned above, the range of the effective magnetic field in which the outer pinned layer and the inner pinned layer can be anti-ferromagnetically coupled via the non-magnetic intermediate layer, will be reduced. Further, the temperature at which anti-ferromagnetic coupling of the pinned layer can be maintained under high temperatures will be reduced. Consequently, this leads to an unfavorable situation in which it is difficult to reliably achieve a large change in magneto-resistance in a wider temperature range and in a larger magnetic field.

SUMMARY OF THE INVENTION

It is an object of the present invention to provide a magneto-resistive effect element for a CPP-GMR element which uses a synthetic pinned layer, which is capable of enhancing anti-ferromagnetic coupling of the synthetic pinned layer, achieving a large change in magneto-resistance, and improving the quality of reproduced output.

It is another object of the present invention to provide a thin-film magnetic head etc. which employ such a magneto-resistive effect element.

According to one aspect of the present invention, a magneto-resistive effect element includes a free layer having a magnetization direction which varies with respect to an external magnetic field; a pinned layer which includes a stacked structure comprising an outer pinned layer which has a magnetization direction that is fixed with respect to the external magnetic field, a non-magnetic intermediate layer which is made of ruthenium with a thickness of about 0.4 nm, and an inner pinned layer with a thickness of 3 nm or more, wherein the inner pinned layer has a magnetization direction which is fixed with respect to the external magnetic field due to anti-ferromagnetic coupling with the outer pinned layer via the non-magnetic intermediate layer; and a spacer layer sandwiched between the free layer and the inner pinned layer. Sense current flows through the pinned layer, the spacer layer, and the free layer substantially in a stacked direction.

In a magneto-resistive effect element as described above, the non-magnetic intermediate layer has a large exchange coupling strength. Therefore, anti-ferromagnetic coupling between the outer pinned layer and the inner pinned layer can be easily ensured even when a thick multi-layered pinned layer is used to achieve a large magneto-resistance ratio. As a result, the magnetization direction of the pinned layer is stabilized even in strong magnetic field, thus allowing for both a large magneto-resistance ratio and good linearity in the waveform in a strong magnetic field.

According to another aspect, a magneto-resistive effect element comprises an anti-ferromagnetic layer made of iridium manganese alloy. This alloy is arranged to be in contact with a surface of the pinned layer opposite to the free layer, and fixes the magnetization direction of the outer pinned layer with respect to the external magnetic field by exchange coupling with the outer pinned layer. The outer pinned layer and the inner pinned layer are both made of cobalt iron alloy. The atomic percent of cobalt in the outer pinned layer increases from the boundary with the anti-ferromagnetic layer toward the boundary with the non-magnetic intermediate layer, while atomic percent of cobalt in the inner pinned layer decreases from the boundary with the non-magnetic intermediate layer toward the boundary with the spacer layer.

In the magneto-resistive effect element as described above, since portions of the outer pinned layer and inner pinned layer, which are in close proximity to the boundaries with the non-magnetic intermediate layer, directly contribute to the anti-ferromagnetic coupling between the outer pinned layer and the inner pinned layer, the exchange coupling strength can be enhanced between the outer pinned layer and the inner pinned layer by increasing the atomic percent of cobalt in these portions. On the other hand, since portions which are remote from the boundaries with the non-magnetic intermediate layer contribute less to the anti-ferromagnetic coupling between the outer pinned layer and the inner pinned layer, the need to increase the atomic percent of cobalt is small. Therefore, it is preferable to set the atomic percent of cobalt in the portion close to the boundary with the anti-ferromagnetic layer such that the exchange coupling with the anti-ferromagnetic layer can be enhanced, taking into account the exchange coupling with the anti-ferromagnetic layer. Additionally, taking into account the bulk scattering, it is preferable to set the atomic percent of cobalt in the portion near the boundary with the spacer layer such that there is sufficient bulk scattering. In this way, by designing the distribution of the atomic percent of cobalt in the pinned layer such that the atomic percent of cobalt is maximum near the non-magnetic intermediate layer and decreases toward the boundaries with the anti-ferromagnetic layer and the spacer layer, the magnetization direction of the pinned layer can be securely fixed with respect to the external magnetic field, and the magneto-resistance ratio can be increased as well.

A head gimbal assembly of the present invention includes: a slider which includes the above-described thin-film magnetic head, and which is arranged opposite to the recording medium; and a suspension for resiliently supporting the slider.

A hard disk drive according to the present invention includes; a slider which includes the above-mentioned thin-film magnetic head, and which is arranged opposite to the disciform recording medium that is rotarily-driven; and a positioning device for supporting the slider and for positioning the slider with respect to the recording medium.

As described above, according to the present invention, particularly when it is applied to a CPP-GMR element using a synthetic pinned layer, the anti-ferromagnetic coupling of the synthetic pinned layer can be enhanced, and the linearity of reproduced outputs can be improved. Further, a large magneto-resistance change can be produced, and the quality of reproduced outputs can be improved. As a result, it is possible to provide thin film magnetic heads and hard disk drives having improved performance.

The above and other objects, features, and advantages of the present invention will become apparent from the following description with reference to the accompanying drawings which illustrates the present invention.

DETAILED DESCRIPTION OF THE INVENTION

Figure 1:
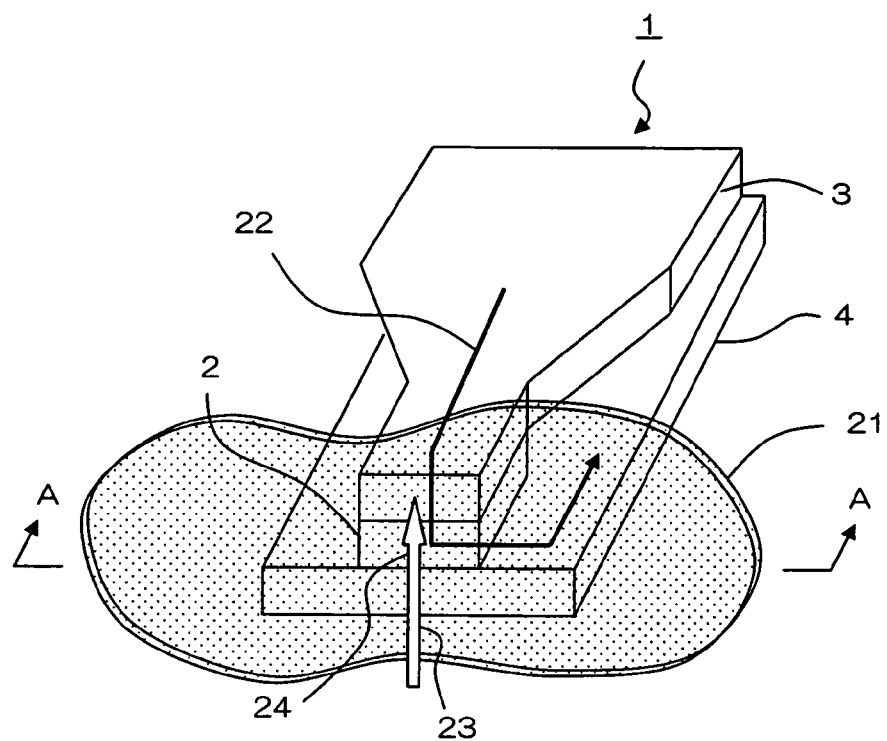
FIG. 1 is a perspective view of a thin-film magnetic head which incorporates a magneto-resistive effect element of the present invention.

An embodiment of a magneto-resistive effect element (hereinafter called a CPP element) of the present invention will be described with reference to the drawings. FIG. 1 is a partial perspective view of thin-film magnetic head 1 using a magneto-resistive effect element of the present invention. Thin-film magnetic head 1 may be a read-only head, or may be an MR/inductive composite head which also has a write head portion. CPP element 2 is sandwiched between upper electrode/shield layer 3 and lower electrode/shield layer 4, with the leading edge thereof positioned on a surface which faces recording medium 21 (hereinafter called air bearing surface 24). As indicated by an arrow in FIG. 1, sense current 22 is applied to CPP element 2 by a voltage applied between upper electrode/shield layer 3 and lower electrode/shield layer 4. Sense current 22 flows from upper electrode/shield layer 3 through CPP element 2 in a stacked direction toward lower electrode/shield layer 4. The magnetic field of recording medium 21 located opposite to CPP element 2 varies as recording medium 21 moves in direction 23. CPP element 2 reads the magnetic information written in each of the magnetic domains of recording medium 21, by detecting the change in the magnetic field as a change in electric resistance of sense current 22 that is caused by the GMR effect.

Figure 2:
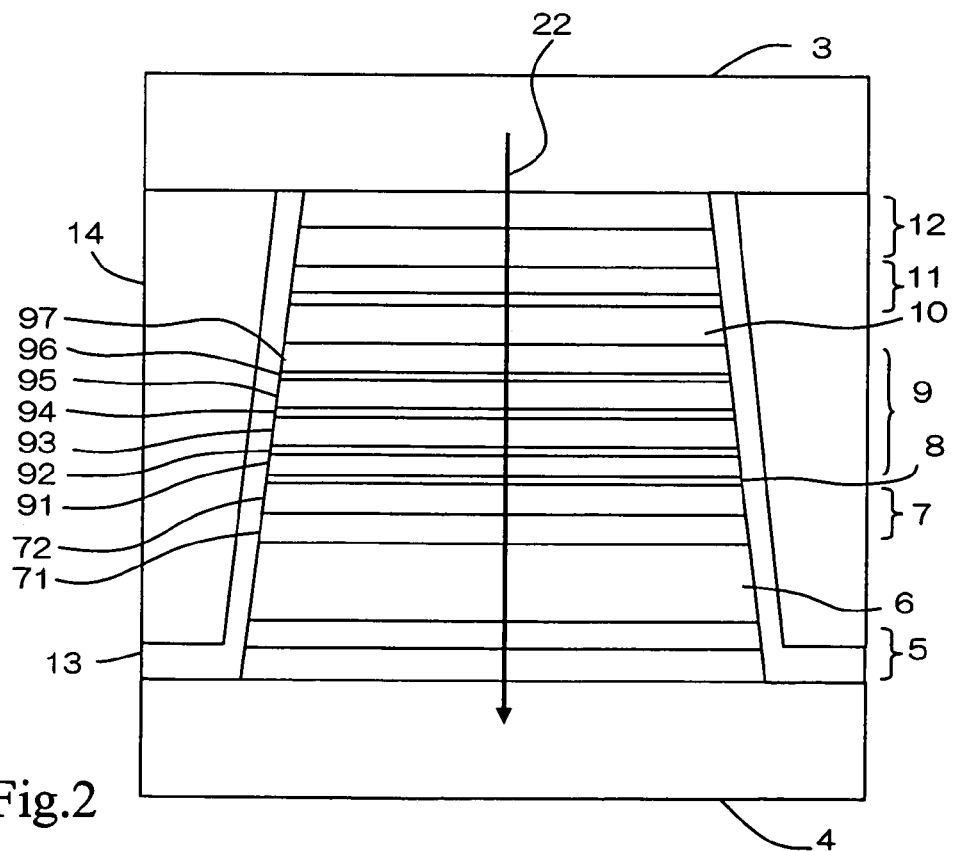
FIG. 2 is a cross-sectional view of the magneto-resistive effect element of FIG. 1 viewed from an air bearing surface.

FIG. 2 illustrates the configuration of CPP element 2 in cross-section. The cross-section is viewed from the A-A direction in FIG. 1, and illustrates the stacked structure viewed from air bearing surface 24.

CPP element 2 has buffer layer 5, anti-ferromagnetic layer 6, outer pinned layer 7, non-magnetic intermediate layer 8, inner pinned layer 9, spacer layer 10, free layer 11, and cap layer 12, stacked in this order on lower electrode/shield layer 4. Upper electrode/shield layer 3 is formed on cap layer 12.

Hard magnetic films 14 are formed on the sides of CPP element 2 with insulating films 13 therebetween.

Outer pinned layer 7 has a magnetization direction that is fixed with respect to the external magnetic field due to exchange coupling with anti-ferromagnetic layer 6. Inner pinned layer 9, in turn, is anti-ferromagnetically coupled with outer pinned layer 7 via non-magnetic intermediate layer 8, and is magnetized in a direction that is anti-parallel with outer pinned layer 7. Free layer 11 varies in magnetization direction with respect to external magnetic field.

Next, each layer will be described in detail. In this specification, the notation of A/B/(C/D)x/E/F, where x is an integer, will be used in order to indicate a layer configuration. The notation of A/B/(C/D)x/E/F means, for example, given that $\underline{x}$ is 2, that a stacked structure has layer A, layer B, layer C, layer D, layer C, layer D, layer E, and layer F stacked in this order. When a layer is shown with parenthesis, such as A (1 nm), the value in the parenthesis indicates the film thickness of the layer. Further, the values in the notation, such as Co70Fe30, indicate atomic percents.

Lower electrode/shield layer 4 serves both as a shield for the read element and as an electrode for the write element. Lower electrode/shield layer 4, for example, may be a NiFe layer with a thickness of about 2 µm.

The composition of buffer layer 5 is selected such that sufficient exchange coupling occurs between anti-ferromagnetic layer 6 and outer pinned layer 7 that is stacked thereon. Ta/NiFeCr may be used, for example.

Anti-ferromagnetic layer 6 may be an IrMn layer with a thickness of about 7 nm.

Outer pinned layer 7 has anti-ferromagnetic layer contacting layer 71 that is in contact with anti-ferromagnetic layer 6, and the outer non-magnetic intermediate layer contacting layer 72 that is in contact with non-magnetic intermediate layer 8. Anti-ferromagnetic layer contacting layer 71 is made of a CoFe layer. The atomic percent of Co in the layer preferably ranges between 65% and 75%, and more preferably around 70%, in order to achieve sufficient exchange coupling with anti-ferromagnetic layer 6. The outer non-magnetic intermediate layer contacting layer 72 is also made of a CoFe layer. The atomic percent of Co in this layer preferably ranges between 70% and 100%. A typical layer configuration and film thickness for outer pinned layer 7 is Co70Fe30 (2 nm)/Co90Fe10 (3 nm). If 100% is chosen for the atomic percent of Co, then the outer non-magnetic intermediate layer contacting layer 72 will be a Co layer. However, such a composition is also included in the above-mentioned CoFe layer. The basis for these compositions will be described later.

Anti-ferromagnetic layer contacting layer 71 may be a multi-layer configuration that consists of thin CoFe layers which differ from each other in the atomic percents of Co. The average atomic percent of Co is in the range between 65% and 75%, and preferably 70%. A typical layer configuration and film thickness for outer pinned layer is 7Co90Fe10 (0.5 nm)/Co30Fe70 (0.5 nm)/Co90Fe10 (5 nm). The inventors of the present invention found that, in this layer configuration, the portion of film up to about 1.6 nm thickness from the boundary with anti-ferromagnetic layer 6 works effectively for exchange coupling with anti-ferromagnetic layer 6. Therefore, in this configuration, the entire Co90Fe10 (0.5 nm) film, the entire Co30Fe70 (0.5 nm) film, and a portion with a thickness 0.6 nm of Co90Fe10 (5 nm) film serve as anti-ferromagnetic layer contacting layer 71, and the average atomic percent of Co is about 70% in the portion of 1.6 nm thickness from the boundary with anti-ferromagnetic layer 6.

A Ru layer with a thickness of about 0.4 nm is preferably used as non-magnetic intermediate layer 8. The basis for the film thickness of about 0.4 nm will be described later. Alternatively, a Ru layer with a thickness of about 0.8 nm may be used as well, depending on the film thickness of the synthetic pinned layer.

Inner pinned layer 9 is a multi-layer film consisting of CoFe layers and Cu layers. The Cu layers are inserted in order to increase a change in resistance due to the boundary scattering effect. Inner pinned layer 9 has inner non-magnetic intermediate layer contacting layer 91 that is in contact with non-magnetic intermediate layer 8, intermediate Cu layer 92, intermediate CoFe layer 93, intermediate Cu layer 94, intermediate CoFe layer 95, intermediate Cu layer 96, and spacer contacting layer 97 that is in contact with spacer layer 10, stacked in this order. The total film thickness of these layers is preferably 3 nm or more in order to achieve a large bulk scattering effect. The atomic percent of Co in the inner non-magnetic intermediate layer contacting layer 91 preferably ranges between 70% and 100%. The atomic percent of Co in spacer contacting layer 97 preferably ranges between 10% and 70%. A typical layer configuration and film thickness is Co90Fe10 (1 nm)/[Cu (0.2 nm)/Co50Fe50 (1.3 nm)]x(where x=2–5). The above-mentioned layer configuration corresponds to x=3. The basis for the composition will be described later.

A Cu layer with a thickness of 1.5 to 3 nm is used as spacer layer 10A. Alternatively, Au or Ag may be used as well.

Free layer 11 is a film whose magnetization direction varies in response to the signal magnetic field of a recording medium. A typical layer configuration of free layer 11 is CoFe/Cu/CoFe/Cu/CoFe. A layer configuration of CoFe/NiFe may also be used. Alternatively, a layer configuration of CoFe/NiFe/CoFe/Cu/CoFe/NiFe/CoFe, which uses NiFe layers as base layers, and covers the both surfaces with CoFe layers, may be used in order to ensure soft magnetic characteristics.

Cap layer 12 is provided to prevent deterioration of the stacked layers. For example, the stacked structure of a Cu layer and a Ru layer each with a thickness of 1 to 5 nm may be used.

Upper electrode/shield layer 3 additionally serves as a shield for the read element, similar to lower electrode shield layer 4. A NiFe layer with a thickness of about 2 μm may be used, for example.

As insulating films 13, oxide films made of material such as $Al_2O_3$ may be used. Hard magnetic films 14 made of material such as CoPt, CoCrPt are formed on the both sides, with insulating layers 13 sandwiched therebetween. Hard magnetic films 14 are magnetic domain control films which apply a hard bias magnetic field to free layer 11 in order to magnetize free layer 11 into a single magnetic domain.

Summarizing the foregoing, Table 1 shows a general configuration and typical layer configurations of CPP element 2. Table 1 shows the composition and the thickness of each layer, beginning from the Ta layer of buffer layer 5 that is in contact with lower electrode/shield layer 4 to the Ru layer of cap layer 10 that is in contact with upper electrode/shield layer 3, i.e., in the stacked order from the lower layer to the upper layer. Although three intermediate Cu layers are inserted in inner pinned layer 9, the number of the layers that can be selected are between two and five, as mentioned above.

TABLE 1

| Layer configuration | | | Composition | Remarks | Typical embodiment 1 | | Typical embodiment 2 | |
|---|---|---|---|---|---|---|---|---|
| | | | | | Composition | Thickness (nm) | Composition | Thickness (nm) |
| Cap layer 12 | | | Ru | | Ru | 5 | Ru | 5 |
| | | | Cu | | Cu | 5 | Cu | 5 |
| Free layer 11 | | | Co90Fe10 | | Co90Fe10 | 1 | Co90Fe10 | 1 |
| | | | Cu | | Cu | 0.2 | Cu | 0.2 |
| | | | Co90Fe10 | | Co90Fe10 | 1 | Co90Fe10 | 1 |
| | | | Cu | | Cu | 0.2 | Cu | 0.2 |
| | | | Co90Fe10 | | Co90Fe10 | 1 | Co90Fe10 | 1 |
| Spacer layer 10 | | | Cu | | Cu | 3 | Cu | 3 |
| Pinned layer | Inner pinned layer 9 | Spacer layer contacting layer 97 | Co(z)Fe(100-z) | Z: 10-70 | Co50Fe50 | 1.3 | Co50Fe50 | 1.3 |
| | | Intermediate Cu Layer 96 | Cu | | Cu | 0.2 | Cu | 0.2 |
| | | Intermediate CoFe Layer 95 | Co(z)Fe(100-z) | Z: 10-70 | Co50Fe50 | 1.3 | Co50Fe50 | 1.3 |
| | | Intermediate Cu Layer 94 | Cu | | Cu | 0.2 | Cu | 0.2 |
| | | Intermediate CoFe Layer 93 | Co(z)Fe(100-z) | Z: 10-70 | Co50Fe50 | 1.3 | Co50Fe50 | 1.3 |
| | | Intermediate Cu Layer 92 | Cu | | Cu | 0.2 | Cu | 0.2 |
| | | Inner non-magnetic intermediate layer contacting layer 91 | Co(y)Fe(100-y) | y: 70-100 | Co90Fe10 | 1 | Co90Fe10 | 1 |
| | Non-magnetic intermediate layer 8 | | Ru | | Ru | 0.4 | Ru | 0.4 |
| | Outer pinned layer 7 | Outer non-magnetic intermediate layer contacting layer 72 | Co(y)Fe(100-y) | y: 70-100 | Co90Fe10 | 3 | Co90Fe10 | 4.4 |
| | | Anti-ferromagnetic layer contacting layer 71 | Co(x)Fe(100-x) | X: 65-75 | Co70Fe30 | 2 | Co90Fe10 | 0.6 |
| | | | | | | | Co30Fe70 | 0.5 |
| | | | | | | | Co90Fe10 | 0.5 |
| Anti-ferromagnetic layer 6 | | | IrMn | | IrMn | 7 | IrMn | 7 |

TABLE 1-continued

|  |  |  | Typical embodiment 1 | | Typical embodiment 2 | |
| --- | --- | --- | --- | --- | --- | --- |
| Layer configuration | Composition | Remarks | Composition | Thickness (nm) | Composition | Thickness (nm) |
| Buffer layer 5 | NiFeCr | | NiFeCr | 5 | NiFeCr | 5 |
| | Ta | | Ta | 1 | Ta | 1 |

The basis for the layer configuration and film thickness according to the present invention will now be described.

(Study 1) First, the basis for the film thickness of non-magnetic intermediate layer 8 will be described. It is known that when the thickness of Ru film, which is used in non-magnetic intermediate layer 8 as described above, is about 0.4 nm and 0.8 nm, two peaks of RKKY-type anti-ferromagnetic coupling respectively occur, and at these specific thicknesses, particularly strong anti-ferromagnetic coupling between outer pinned layer 7 and inner pinned layer 9 occurs, so that inner pinned layer 9 is strongly fixed against the external magnetic field. This coupling strength is called the exchange coupling strength. It is known that the exchange coupling strength of Ru is larger when the thickness is about 0.4 nm than about 0.8 nm.

Conventionally, a CIP-GMR element having a small film thickness (about 1.5 nm thickness) has been widely used, and even for a CPP-GMR element which has a larger film thickness (about 3 nm), the film thickness is limited. For this reason, a Ru layer with a thickness of about 0.8 nm has been used because it has an effective magnetic field range (about ±80 kA/m) which is sufficiently wide, and a processable saturation magnetic field (about 640 kA/m). However, if a thicker multi-layer synthetic pinned layer is used in a CPP-GMR element in order to obtain a larger magneto-resistance ratio, then it is difficult for the conventional Ru layer having about 0.8 nm thickness to ensure that the anti-ferromagnetic coupling will occur within a sufficiently wide effective magnetic field range. As a result, with a non-magnetic intermediate layer which exhibits weaker exchange coupling such as a Ru layer having about 0.8 nm thickness, the magnetization direction of the pinned layer is changed even by small magnetic field, thus deteriorating the linearity of the waveform in a strong magnetic field. Therefore, from the viewpoint of practical use as a hard disk head, it is necessary to use a non-magnetic intermediate layer which has larger exchange coupling strength, if the magneto-resistance ratio is on a similar level.

The Ru layer with a thickness of about 0.4 nm is preferable from this point of view as well. It is known that the Ru layer having a thickness of about 0.4 nm has an exchange coupling coefficient of 0.5 µJ/cm$^2$ for a layer configuration of Co/Ru/Co [S. S. P. Parkin, Phys. Rev. Lett. 64, 2304 (1990)]. However, the CPP-GMR element of the present invention uses a CoFe layer, which has a bulk scattering coefficient larger than a Co layer in order to increase the change in magneto-resistance. The effect of the film thickness of the Ru layer in the layer configuration shown in Table 1 on the read characteristics of the element has not been confirmed. As such, the characteristics, both as an unprocessed film, and as an element, were studied for a layer configuration which employs a CoFe-based inner pinned layer and outer pinned layer.

(Study 1-1) First, exchange coupling coefficients were compared for Ru layers having thicknesses of about 0.4 nm and about 0.8 nm on condition that the layers were not processed. Table 2 shows the layer configurations of the pinned layers used in the study.

TABLE 2

| Layer configuration | Composition | Thickness (nm) |
| --- | --- | --- |
| Cap layer | Ta | 2.0 |
| | Cu | 2.0 |
| Inner pinned layer | Co50Fe50 | 1.5 |
| | Cu | 0.2 |
| | Co50Fe50 | 1.5 |
| | Cu | 0.2 |
| | Co50Fe50 | 1.5 |
| | Cu | 0.2 |
| | Co90Fe10 | 1.0 |
| Non-magnetic intermediate layer | Ru | 0.4 |
| Outer pinned layer | Co90Fe10 | 5.5 |
| Buffer layer | NiFeCr | 5.0 |

Figure 3:
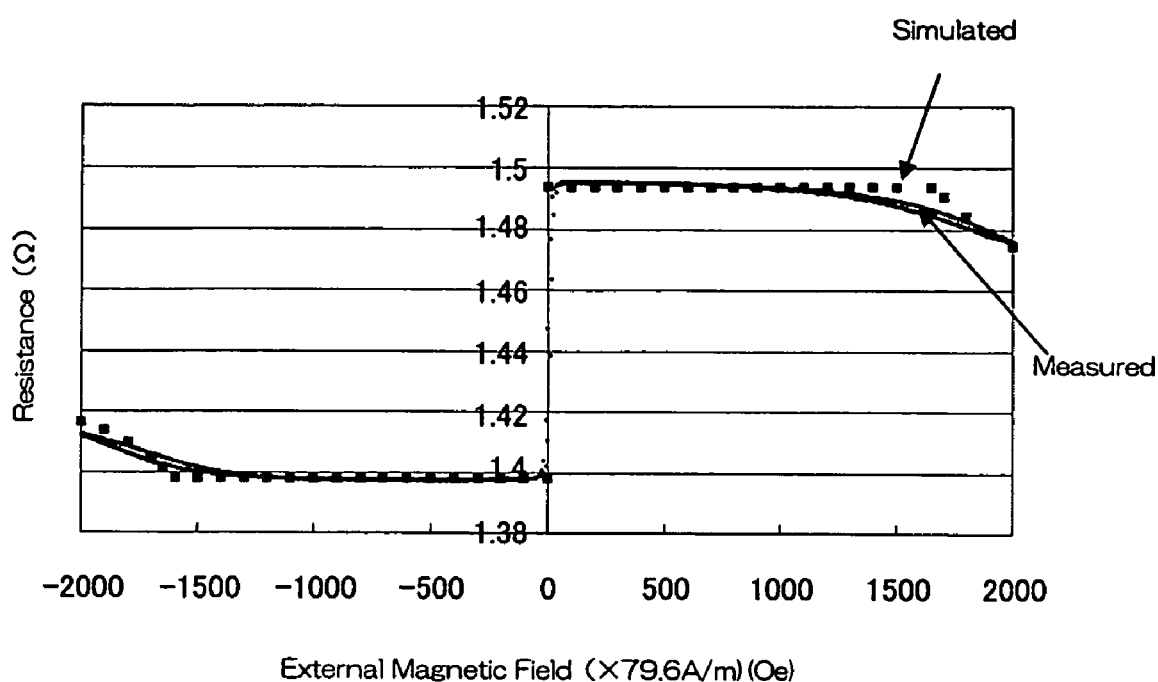
FIG. 3 is a diagram showing the relationship between the film thickness of the Ru layer and magneto-resistance when an SV film is formed without patterning.

A magnetic field was applied to the unprocessed film having a pinned layer that is shown in the above table in order to determine the magnetic field at which the magnetization of the pinned layer is inverted. Since the exchange coupling coefficient is proportional to the magnetic field in which the magnetization of the pinned layer is inverted, the value of the exchange coupling coefficient can be estimated from this measurement. The value was estimated to be 0.27 µJ/cm$^2$. FIG. 3 shows the relationship between the applied magnetic field and the magneto-resistance, together with the comparison between the calculated result and the experimental result. The calculated result precisely traces the experimental result at the exchange coupling coefficient of 0.27 µJ/cm$^2$, thus the reliability of the value 0.27 µJ/cm$^2$ was confirmed also from the calculation result. On the other hand, when the Ru layer thickness was about 0.8 nm in the above table, the exchange coupling coefficient was estimated to be 0.11 µJ/cm$^2$. It was therefore found that the exchange coupling coefficient can be largely improved by setting the film thickness to be about 0.4 nm. This value is sufficient to anti-ferromagnetically couple magnetic layers which have magnetic moments corresponding to Co90Fe10 (6 nm). The magnetic field that is required for the pinned layer to be annealed was estimated to be about 525000 A/m from the estimated exchange coupling coefficient, which is well within the annealing capability of a current annealing device.

Figure 4:
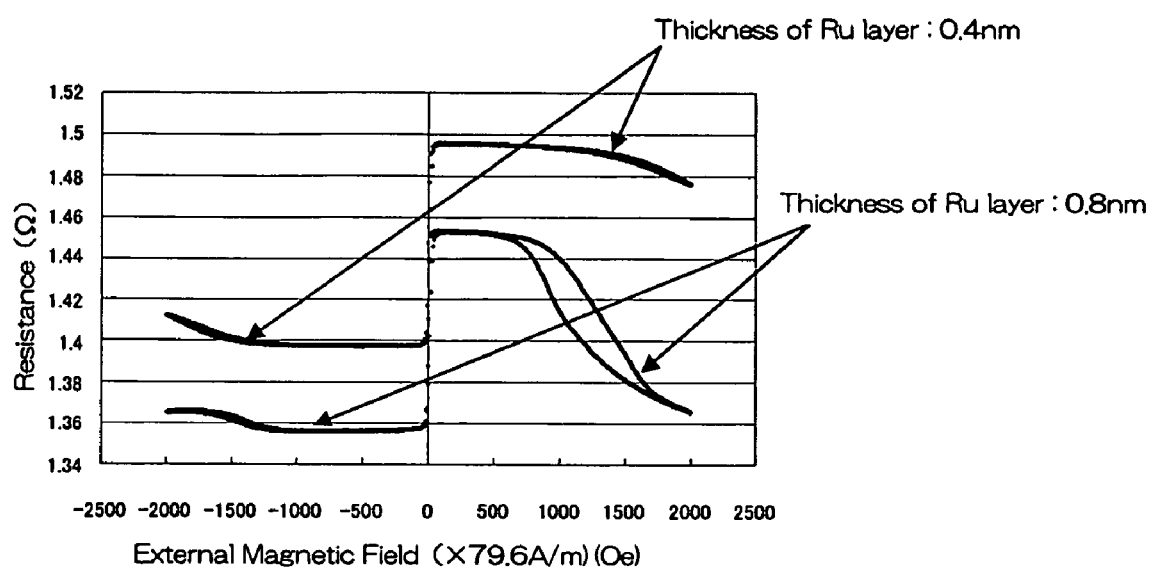
FIG. 4 is a diagram showing the relationship between the film thickness of the Ru layer and magneto-resistance when an SV film is formed without patterning.

FIG. 4 shows the relationship between the applied magnetic field and magneto-resistance when the thickness of the Ru layer is about 0.4 nm and about 0.8 nm. It was confirmed that the range of the effective magnetic field was increased, because the Ru layer whose thickness is about 0.4 nm exhibits a larger exchange coupling coefficient than the layer having about 0.8 nm thickness. One of the two lines in the figure corresponds to the increasing magnetic field and the other line corresponds to the decreasing applied magnetic field.

(Study 1-2) Next, based on the above experimental result for the unprocessed film, the performance of the element was compared between a Ru layer having a thickness of about 0.4 nm and a Ru layer having about 0.8 nm thickness.

The layer configuration of the head that was used was the same as that shown in typical embodiment 2 in Table 1. The junction size was set to 0.1×0.1 µm. CoCrPt layers having thicknesses of 25 nm were used as the hard magnetic films, and were magnetized by the magnetic field of 400 kA/m. A further experiment was also performed for the case in which no hard bias magnetic field was applied. The sense current at the time of conducting the experiment was set to 5 mA. Magnetic field of ±32 kA/m was applied to the pinned layer.

Figure 5A:
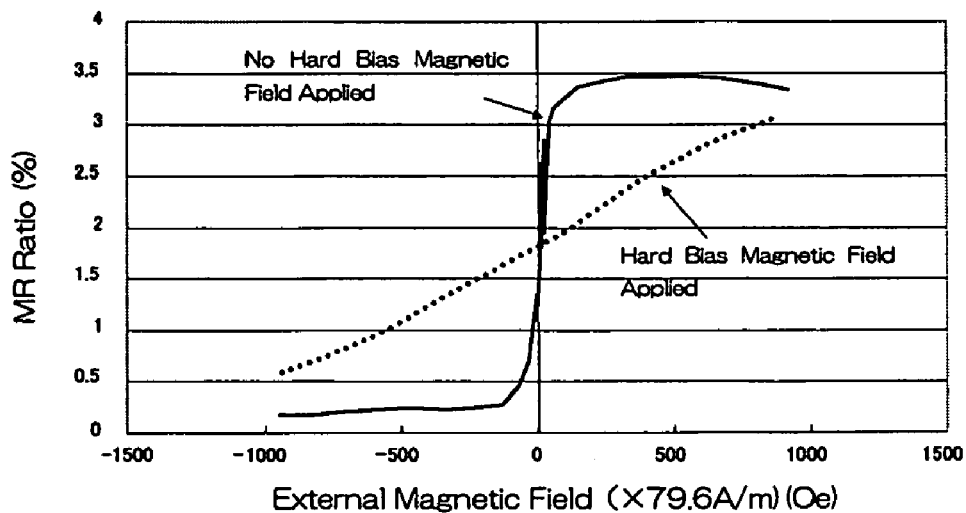
FIG. 5A is a diagram showing the relationship between the film thickness of the Ru film and magneto-resistance in a magnetic head which incorporates the magneto-resistive effect element of the present invention.
Figure 5B:
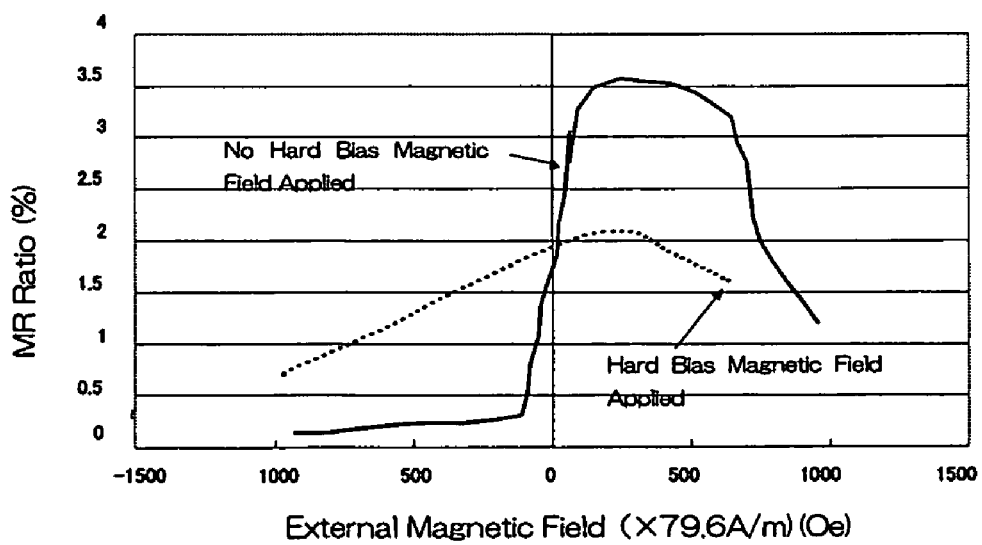
FIG. 5B is a graph showing the relationship between the film thickness of the Ru film and magneto-resistance in the magnetic head which incorporates the magneto-resistive effect element of the present invention.

FIG. 5A and FIG. 5B show MR curves when the Ru layer has a thickness of about 0.4 nm, and a thickness of about 0.8 nm, respectively. The MR curves show a tendency similar to that in FIG. 4, when no hard bias magnetic field is applied. Further, it was found that, for a Ru layer with a thickness of about 0.4 nm, the output voltage exhibits a good linearity when the hard bias magnetic field is applied. This is because that the range of the effective magnetic field is increased due to the large exchange coupling coefficient of the Ru layer having a thickness of about 0.4 nm, and therefore, the magnetization of the pinned layer is less prone to be inverted even when the hard bias magnetic field is applied.

(Study 2) Next, the optimal composition of anti-ferromagnetic layer contacting layer 71 was studied. Table 3 shows the composition and the film thickness of anti-ferromagnetic layer contacting layer 71 used in the study. The entire layer configuration of the CPP element was the same as in typical embodiments 1, 2 in Table 1 except for anti-ferromagnetic layer contacting layer 71. The average atomic percent of Co throughout anti-ferromagnetic contacting layer 71 was varied by changing the film thicknesses x, y, z, of CoFe layers which form anti-ferromagnetic contacting layer 71.

TABLE 3

| Layer configuration | Composition | Thickness (nm) |
|---|---|---|
| Anti-ferromagnetic layer contacting layer 71 | Co90Fe10 | x |
| | Co50Fe50 | y |
| | Co90Fe10 | z |

Figures 6A, 6B:
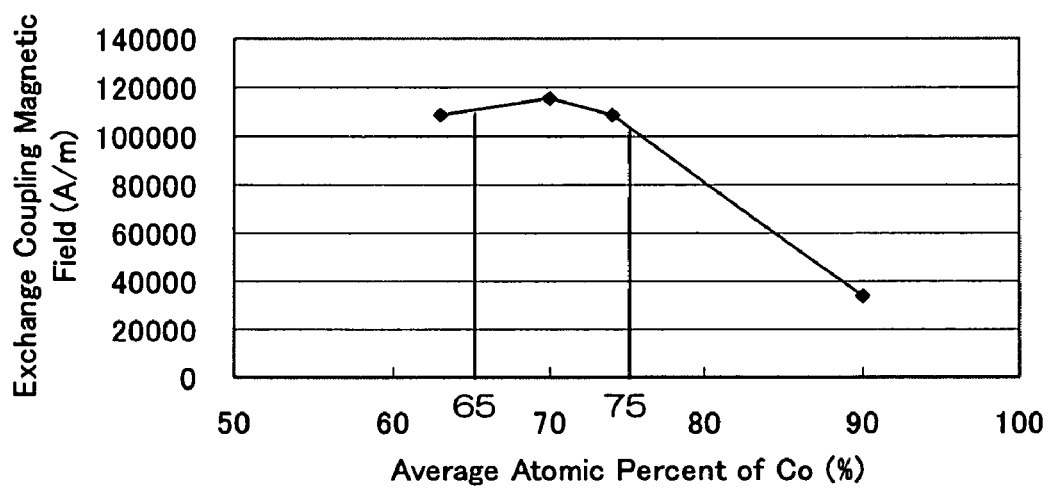
FIG. 6A is a diagram showing the relationship between the atomic percent of Co in an anti-ferromagnetic layer contacting layer in the magneto-resistive effect element of the present invention and the strength of exchange coupling magnetic field.
FIG. 6B is a graph showing the relationship between the atomic percent of Co in the anti-ferromagnetic layer contacting layer in the magneto-resistive effect element of the present invention and the strength of exchange coupling magnetic field.

FIGS. 6A, 6B show the relationship between the average atomic percent of Co in anti-ferromagnetic layer contacting layer 71 and the exchange coupling magnetic field between pinned layer 7 and anti-ferromagnetic layer 6, when a Ru layer having a thickness of about 0.4 nm was used as non-magnetic intermediate layer 8. It is found from these figures that the exchange coupling magnetic field exhibits a large value in the range of an average atomic percent of Co between 65% and 75%, and exhibits the maximum value at 70%. Further, although it is not shown, it was confirmed that the exchange coupling magnetic field exhibits a similar value when anti-ferromagnetic contacting layer 71 is made of a single layer of Co70Fe30.

(Study 3) Next, the optimal range of the composition of the outer non-magnetic intermediate layer contacting layer 72 and the inner non-magnetic intermediate layer contacting layer 91 was studied. The entire layer configuration of the CPP element that was used was same as in typical embodiment 1 in Table 1. The atomic percents of Co in the outer non-magnetic intermediate layer contacting layer 72 and of the inner non-magnetic intermediate layer contacting layer 91 were varied between 50% and 100%, with both values set equal to each other. Taking the operating temperature into consideration, data were measured both at 293 K (20° C.) which was room temperature, and at 623 K (350° C.) which was a stress temperature, in order to evaluate the exchange coupling strength at the actual environmental temperature.

The reference value for evaluation of the exchange coupling strength was chosen to be 0.2 µJ/cm$^2$. This is a value that is necessary for the film configuration shown in Table. 1 to achieve sufficient exchange coupling within ±80 kA/m, which is the range that is necessary for an effective magnetic field for a practical application. For a CIP-GMR element, which generally has a pinned layer with a thickness of about 2 nm, when converted to the equivalent thickness for 90Co10Fe, the exchange coupling strength of 0.12 µJ/cm$^2$, which can be obtained by a Ru layer with a thickness of about 0.8 nm, will be sufficient. On the other hand, in a CPP-GMR element shown in Table 1, the film thicknesses of the inner pinned layer and outer pinned layer are about 6 nm, when converted to the equivalent thickness for 90Co10Fe, in order to achieve a large magneto-resistance ratio. Therefore, a larger exchange coupling strength is required.

Figures 7A, 7B:
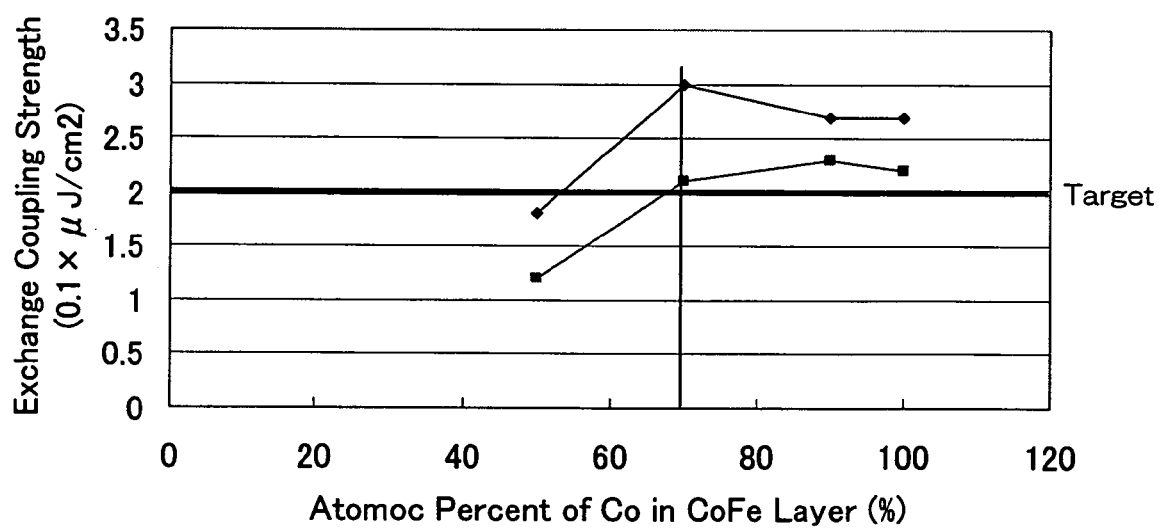
FIG. 7A is a diagram showing the relationship between the atomic percent of Co in the Ru layer contacting layer in the magneto-resistive effect element of the present invention and the strength of exchange coupling magnetic field.
FIG. 7B is a graph showing the relationship between the atomic percent of Co in the Ru layer contacting layer in the magneto-resistive effect element of the present invention and the strength of exchange coupling magnetic field.

FIGS. 7A, 7B show the relationship between, the atomic percents of Co in the outer non-magnetic intermediate layer contacting layer 72 and the inner non-magnetic intermediate layer contacting layer 91, and the exchange coupling strength between inner pinned layer 7 and outer pinned layer 9, when a Ru layer having a thickness of about 0.4 nm was used as non-magnetic intermediate layer 8. As will be understood from the figures, the exchange coupling strength depends on the atomic percents of Co in the outer non-magnetic intermediate layer contacting layer 72 and non-magnetic intermediate layer inner adjacent layer 91, and an atomic percent of Co of about 60% or more is necessary at room temperature in order to achieve an exchange coupling strength which can be used in practical applications. When considering that the element is used as a head element within a hard disk drive at environmental temperature, an atomic percent of Co of about 70% or more is required to achieve sufficient exchange coupling strength. It was found from the foregoing, that the atomic percents of Co in the outer non-magnetic intermediate layer contacting layer 72 and the inner non-magnetic intermediate layer contacting layer 91 were preferably in the range between 70% and 100%. Additionally, similar results were obtained for a CPP element t that has an entire layer configuration shown in typical embodiment 2 in FIG. 1.

Figure 8:
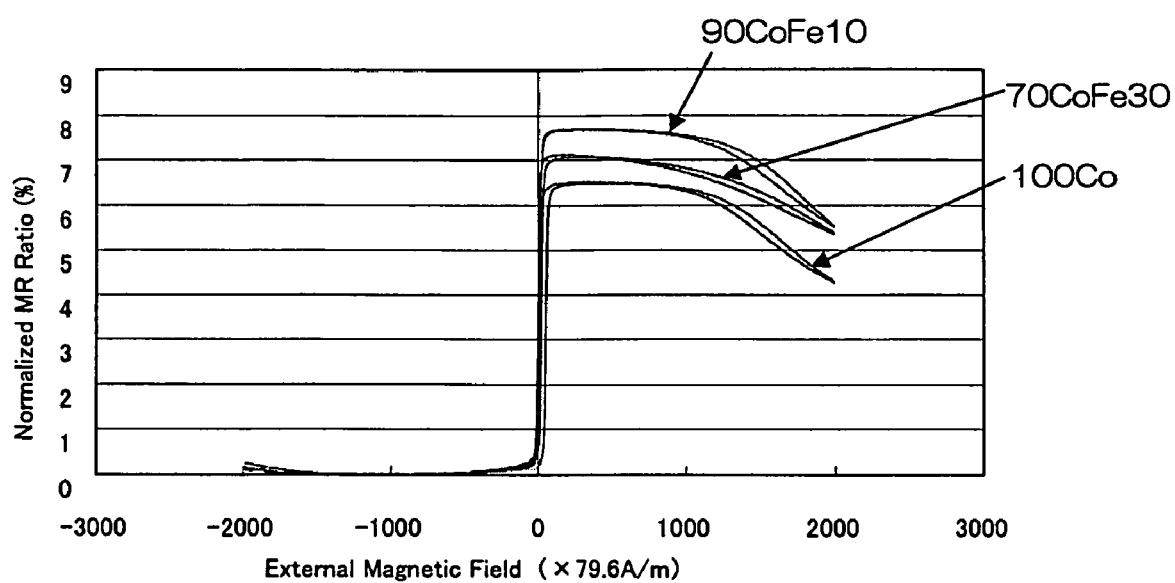
FIG. 8 is a diagram showing the relationship between atomic percents of Co in an outer non-magnetic intermediate layer contacting layer and an inner non-magnetic intermediate layer contacting layer in the magneto-resistive effect element of the present invention and a magneto-resistance ratio.

Annealing conditions in the process for fabricating a CPP-GMR element are 748 kA/m and 543 K (270° C.). When 70Co30Fe is used at the boundaries with non-magnetic intermediate layer 8 under these annealing conditions, the pinned layer is not sufficiently annealed because the exchange coupling coefficient is too large to complete the saturated magnetization of the pinned layer in the direction of the magnetic field. As a result, the magnetization direction of the pinned layer is fixed relative to non-magnetic layer 6 at a certain angle. The anti-parallel condition cannot be achieved properly with respect to the free layer in a low magnetic field range, and the range of the effective magnetic field in which the linearity of the output voltage is maintained will be significantly reduced, when the element is actually assembled into an apparatus. FIG. 8 shows the relationship between the external electric field and the magneto-resistance ratio (normalized) for an unprocessed film at room temperature. For the cases of 90CoFe and 100Co, the flat regions of magnetic field extend from zero to near 80 kA/m, whereas for the case of 70Co30Fe, the region is reduced to as small as about 16 kA/M. Taking into account of the performance of an actual element, it is preferable that the atomic percents of Co in the outer non-magnetic intermediate layer contacting layer 72 and the inner non-magnetic intermediate layer contacting layer 91 are set in the range of 90 to 100%.

(Study 4) Next, the optimal composition for spacer contacting layer 97 was studied. The compositions of intermediate CoFe layers 93, 95 may be set appropriately to adjust the magnetic characteristics. However, these layers were set equal to spacer layer contacting layer 97 in this study, because the characteristics that are required for intermediate CoFe layers 93, 95 are large spin scattering on the boundaries and large bulk scattering, similar to spacer layer contacting layer 97, and thus, it is effective to use the same composition for intermediate CoFe layers 93, 95 as for spacer layer contacting layer 97.

Table 4 shows the composition and the film thickness of inner pinned layer 9 used in the study. The entire layer configuration of the CPP element that was used was the same as in typical embodiment 2 in Table 1. Table 4 shows the layer configuration of the pinned layer. The atomic percent of CoFe in the inner non-magnetic intermediate layer contacting layer 91 was set to 90%. The atomic percents in intermediate CoFe layers 93, 95 and spacer layer contacting layer 97 were varied as parameters to investigate the influence of the atomic percent of Co. The dependency of the magneto-resistance ratio was evaluated based on the above-mentioned viewpoint.

(Study 5) Finally, the performance of a head, in which the magneto-resistive effect element having the element configuration illustrated in FIG. 1 was incorporated as a head element, was verified by using an r-H curve. The layer configuration of the head that was used was the same as that shown in typical embodiment 2 in Table 1. The junction size was set to 0.1×0.1 m. CoCrPt layers with a thickness of 25 nm were used as the hard magnetic films, and were magnetized by a magnetic field of 400 kA/m. The sense current at the time of conducting the experiment was set to 5 mA. A magnetic field of ±32 kA/m was applied to the pinned layer. For reference, the r-H curve is a curve which represents a change in resistance with respect to an external magnetic field. Since the r-H curve reflects the magnetic characteristics of a pinned layer directly, it is considered easier to verify the effect of the present invention than to do a comparison of dynamic performances.

Figure 10A:
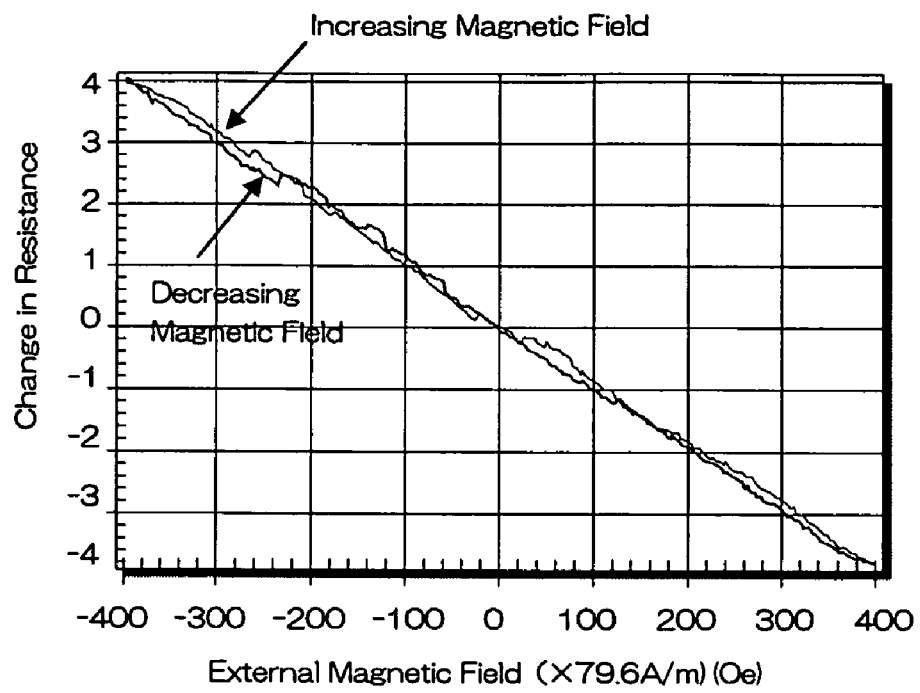
FIG. 10A is a diagram showing an r-H curve of a magneto-resistive effect element of the present invention.
Figure 10B:
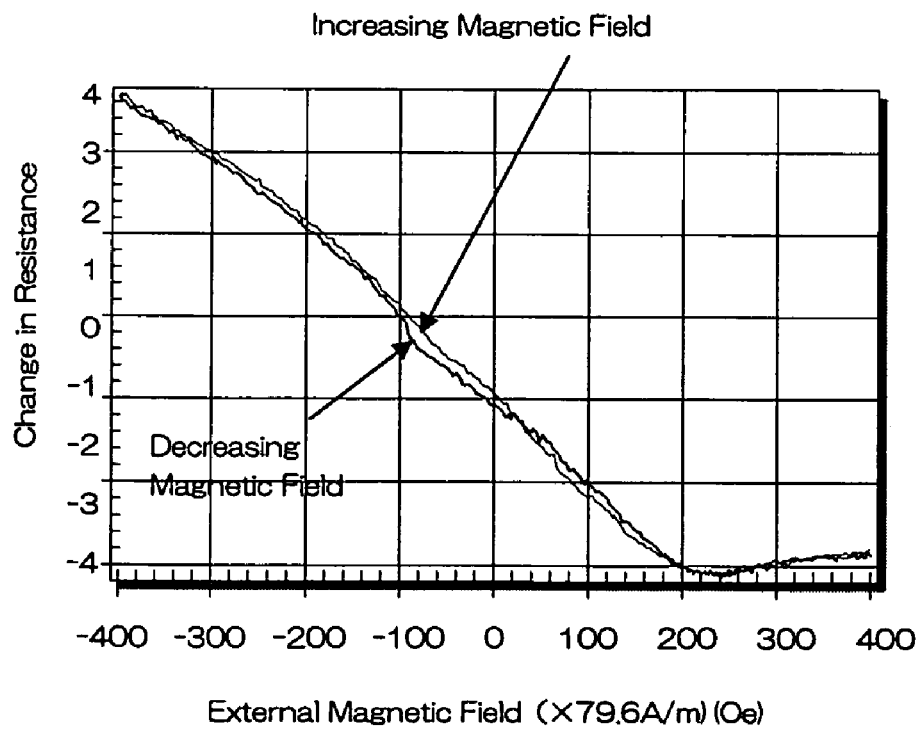
FIG. 10B is a diagram showing an r-H curve of a magneto-resistive effect element of prior art.

FIGS. 10A, 10B show typical embodiments of the r-H curves. FIG. 10A is an r-H curve when the magneto-resistive effect element of the present invention was used, while FIG. 10B is an r-H curve when a prior art magneto-resistive effect element was used. One of the two lines in the figure corresponds to the increasing magnetic field and the other line corresponds to the decreasing applied magnetic field. The r-H curves in FIG. 10B show valley-type curves, thus good linearity is not maintained within the range of the applied magnetic field. Although this example shows a valley shape, the r-H curve may take a ridge shape. The failure in maintaining linearity will be due to the weak anti-ferromagnetic coupling of the synthetic pinned layer, which causes the pinned layer to start rotating. On the other hand, the r-H curves in FIG. 10A maintain a good linearity within the range of the applied magnetic field, thus the effect of the present invention was proven.

Table 5 shows a comparison of the reproduced output and the probability of inversion of the pinned layer when a magnetic field of 32 kA/m was applied, on condition that the

TABLE 4

| Layer configuration | | | Composition | Thickness (nm) |
|---|---|---|---|---|
| Pinned layer | Inner pinned layer 9 | Spacer layer contacting layer 97 | Co(x)Fe(100−x) | 1.3 |
| | | Intermediate Cu Layer 96 | Cu | 0.2 |
| | | Intermediate CoFe Layer 95 | Co(x)Fe(100−x) | 1.3 |
| | | Intermediate Cu Layer 94 | Cu | 0.2 |
| | | Intermediate CoFe Layer 93 | Co(x)Fe(100−x) | 1.3 |
| | | Intermediate Cu Layer 92 | Cu | 0.2 |
| | | Inner non-magnetic intermediate layer contacting layer 91 | Co90Fe10 | 1 |
| | Non-magnetic intermediate layer 8 | | Ru | 0.4 |
| | Outer pinned layer 7 | Outer non-magnetic intermediate layer contacting layer 72 | Co90Fe10 | 4.4 |
| | | Anti-ferromagnetic layer contacting layer 71 | Co90Fe10 | 0.6 |
| | | | Co30Fe70 | 0.5 |
| | | | Co90Fe10 | 0.5 |

Figures 9A, 9B:
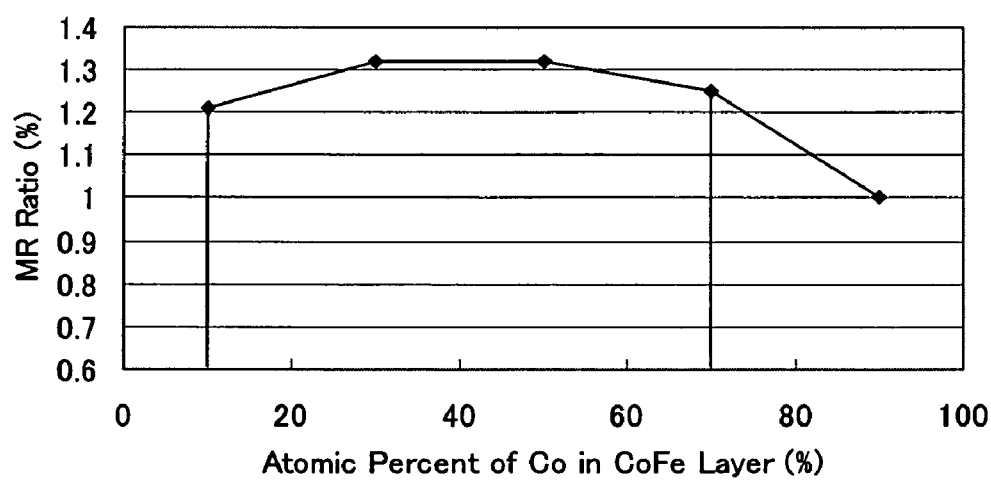
FIG. 9A is a diagram showing the relationship between, the atomic percents of Co in intermediate CoFe layers and a spacer layer contacting layer in the magneto-resistive effect element of the present invention, and the magneto-resistance ratio.
FIG. 9B is a graph showing the relationship between the atomic percents of Co in the intermediate CoFe layers and the spacer layer contacting layer in the magneto-resistive effect element of the present invention and the magneto-resistance ratio.

FIGS. 9A, 9B show the relationship between the atomic percents of Co in intermediate CoFe layers 93, 95 and spacer layer contacting layer 97 and the magneto-resistance ratio. As will be apparent from the figures, it was found that, in a multi-layer configuration of CoFe and Cu, too large atomic percent of Co is not preferable, and the atomic percent of Co in intermediate CoFe layers 93, 95 and spacer layer contacting layer 97 should be in a range of 10% to 70% to obtain a larger change in magneto-resistance.

atomic percents of Co in intermediate layers 93, 95 and spacer layer contacting layer 97 were varied, based on typical embodiment 1 in Table. 1. Similarly, Table 6 shows a comparison of the same evaluation items, when the atomic percents of Co in the outer non-magnetic intermediate layer contacting layer 72 and the inner non-magnetic intermediate layer contacting layer 91, which are both in contact with non-magnetic intermediate layer 8, were varied, based on typical embodiment 2 in Table 1.

TABLE 5

| Layer configuration | | Thickness (nm) | | Composition of the present invention | Composition of a comparative sample |
|---|---|---|---|---|---|
| Inner pinned layer 9 | Spacer layer contacting layer 97 | 1.3 | | Co50Fe50 | |
| | Intermediate Cu Layer 96 | 0.2 | | Cu | |
| | Intermediate CoFe Layer 95 | 1.3 | | Co50Fe50 | |
| | Intermediate Cu Layer 94 | 0.2 | | Cu | |
| | Intermediate CoFe Layer 93 | 1.3 | | Co50Fe50 | |
| | Intermediate Cu Layer 92 | 0.2 | | Cu | |
| | Inner non-magnetic intermediate layer contacting layer 91 | 1 | | Co90Fe10 | Co50Fe50 |
| Non-magnetic intermediate layer 8 | | 0.4 | | Ru | |
| Outer pinned layer 7 | Outer non-magnetic intermediate layer contacting layer 72 | Present invention 4.3 | Comparative sample 3.3 | Co90Fe10 | Co50Fe50 |
| | Anti-ferromagnetic layer contacting layer 71 | 1.5 | | Co70Fe30 | |
| Anti-ferromagnetic layer 6 | | 7 | | IrMn | |
| Normalized output | | | | 1 | 1.3 |
| Normalized probability of the pinned layer inversion | | | | 1 | 5 |

TABLE 6

| Layer configuration | | Thickness (nm) | Composition of the present invention | Composition of a comparative sample |
|---|---|---|---|---|
| Inner pinned layer 9 | Spacer layer contacting layer 97 | 1.3 | Co50Fe50 | Co90Fe10 |
| | Intermediate Cu Layer 96 | 0.2 | Cu | |
| | Intermediate CoFe Layer 95 | 1.3 | Co50Fe50 | Co90Fe10 |
| | Intermediate Cu Layer 94 | 0.2 | Cu | |
| | Intermediate CoFe Layer 93 | 1.3 | Co50Fe50 | Co90Fe10 |
| | Intermediate Cu Layer 92 | 0.2 | Cu | |
| | Inner non-magnetic intermediate layer contacting layer 91 | 1 | Co90Fe10 | |
| Non-magnetic intermediate layer 8 | | 0.4 | Ru | |
| Outer pinned layer 7 | Outer non-magnetic intermediate layer contacting layer 72 | 4.4 | Co90Fe10 | |
| | Anti-ferromagnetic layer contacting layer 71 | 0.6 | Co90Fe10 | |
| | | 0.5 | Co30Fe70 | |
| | | 0.5 | Co90Fe10 | |
| Anti-ferromagnetic layer 6 | | 7 | IrMn | |
| Normalized output | | | 1 | 0.7 |
| Normalized probability of the pinned layer inversion | | | 1 | 1 |

From these comparisons, when two CoFe layers that sandwich the Ru layer, which is non-magnetic intermediate layer 8, have small atomic percents of Co, as shown in Table 5, the anti-ferromagnetic coupling becomes weak, so that the pinned layer is more prone to be inverted. When the inner pinned layer has a large atomic percent of Co, as shown in Table 6, the reproduced output is reduced. Thus, the magneto-resistive effect element of the present invention was proven to provide improved read characteristics when it is applied as well to a read head.

As described above, by using the above-mentioned layer configuration in a synthetic pinned layer of a CPP-GMR element, a large magneto-resistance ratio can be achieved. Furthermore, a strong exchange coupling magnetic field between the pinned layer and anti-ferromagnetic film 6, and a strong anti-ferromagnetic coupling magnetic field within the pinned layer, via non-magnetic intermediate layer 8, can be achieved simultaneously. The above description was made on the assumption that a Ru layer having a thickness of about 0.4 nm was used as the non-magnetic intermediate layer, and similar effects are expected to occur when a Ru layer having about 0.8 nm thickness is used. The above description, therefore, is not intended to limit the present invention to the application of the Ru layer having a thickness of about 0.4 nm.

Figure 11:
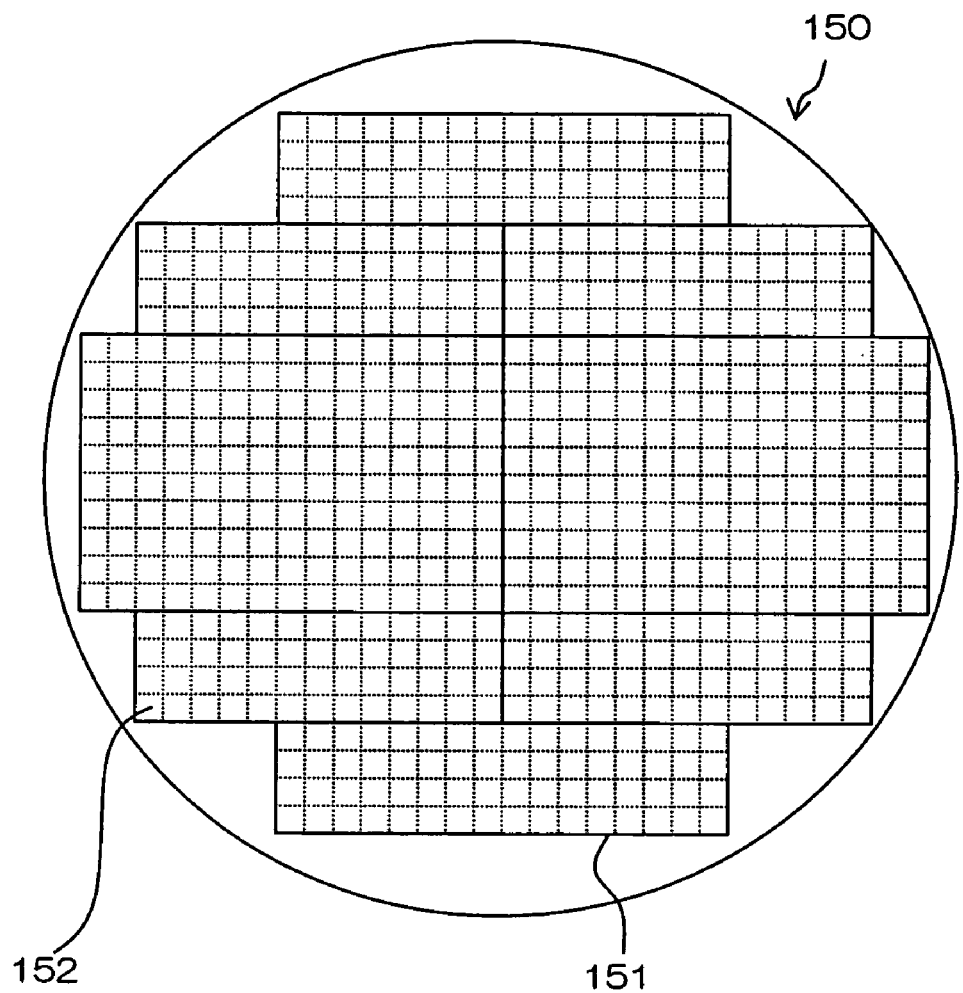
FIG. 11 is a plan view of a wafer associated with manufacturing a thin-film magnetic head according to the present invention.

Next, explanation will be made regarding a wafer for fabricating a thin-film magnetic head in which the above-described CPP element 2 is used as a head element. FIG. 11 is a schematic plan view of a wafer. Wafer 150 is partitioned into a plurality of thin-film magneto-electric transducer assemblies 151. Each thin-film magneto-electric transducer assembly 151, which includes thin-film magneto-electric transducers 152 each having a stacked CPP element 2, serves as a work unit in the process of polishing air bearing surface 24. Margins (not shown) that are to be cut out are provided between thin-film magneto-electric transducer assemblies 151, and between thin-film magneto-electric transducers 152.

Figure 12:
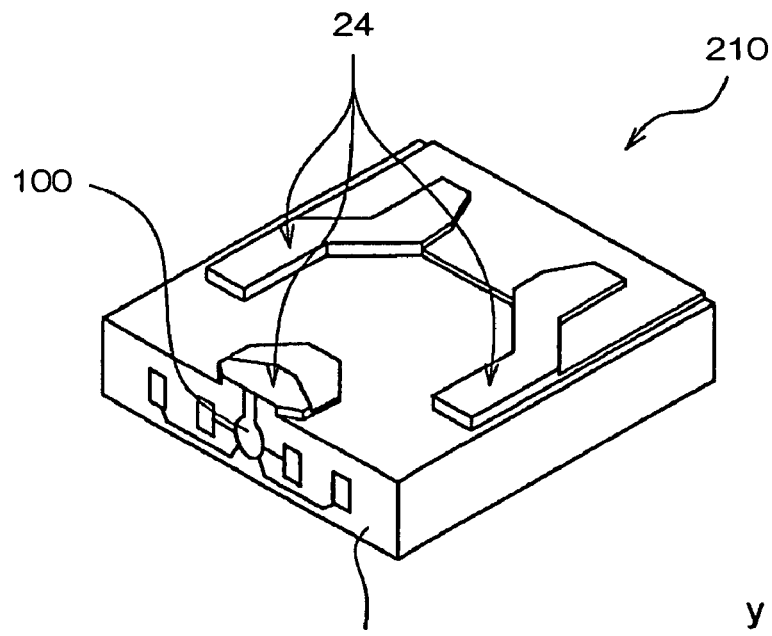
FIG. 12 is a perspective view illustrating a slider, included in a head gimbal assembly, which incorporates a thin-film magnetic head according to the present invention.

Explanation next regards a head gimbal assembly and a hard disk drive that uses CPP element 2 as a head element. Referring to FIG. 12, slider 210 which is included in the head gimbal assembly will be described first. In a hard disk drive, slider 210 is arranged opposite to a hard disk, which is a rotarily-driven disciform storage medium. Slider 210 has body 211 mainly formed of a substrate and an overcoat layer (not shown). Body 211 has a substantially hexahedral form. One of the six surfaces of body 211 is positioned opposite to the hard disk. Air bearing surface 24 is formed on this surface. When the hard disk rotates in the z direction shown in FIG. 12, an airflow which passes between the hard disk and slider 210 creates a dynamic lift which is applied to slider 210 downward in the y direction of FIG. 12. Slider 210 is configured to be lifted away from the surface of the hard disk by this dynamic lift. For reference, the x direction in FIG. 12 is the transverse direction with regard to the track of the hard disk. In proximity to the trailing edge (the end portion at the lower left in FIG. 12) of slider 210, which is on the outlet side of the airflow, thin-film magnetic head 100 that uses CPP element 2 as a head element is formed.

Figure 13:
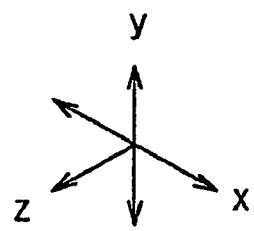
FIG. 13 is a perspective view illustrating a head arm assembly including the head gimbal assembly which incorporates a thin-film magnetic head according to the present invention.
Figure 13:
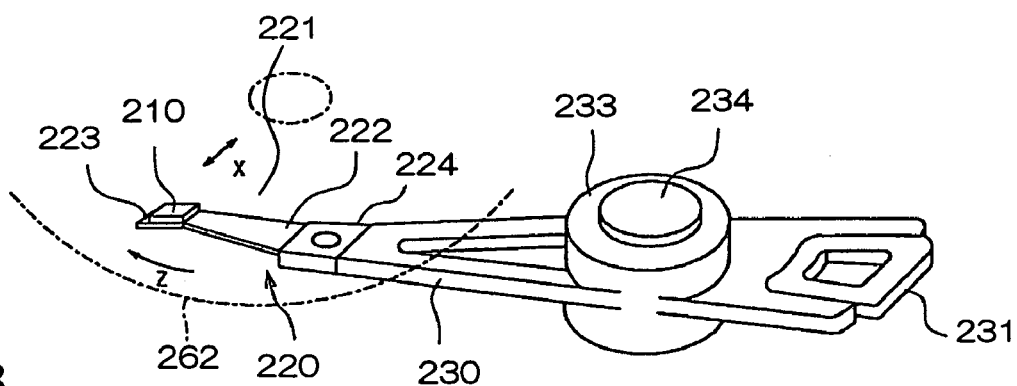

Referring to FIG. 13, head gimbal assembly 220 that uses CPP element 2 as a head element will be explained next. Head gimbal assembly 220 is provided with slider 210 and suspension 221 for resiliently supporting slider 210. Suspension 221 has; load beam 222 in the shape of a flat spring and made of, for example, stainless steel; flexure 223 attached to one end of load beam 222, and to which slider 210 is fixed, while providing an appropriate degree of freedom to slider 210; and base plate 224 provided on the other end of load beam 222. Base plate 224 is adapted to be attached to arm 230 of the actuator which moves slider 210 in the transverse direction x with regard to the track of hard disk 262. The actuator is provided with arm 230 and a voice coil motor for driving arm 230. The portion of the flexure to which slider 210 is attached has a gimbal section for maintaining slider 210 in a fixed orientation.

Head gimbal assembly 220 is attached to arm 230 of the actuator. The arrangement in which a head gimbal assembly is attached to a single arm is called a head arm assembly. The arrangement in which a head gimbal assembly 220 is attached to the respective arm of a carriage having a plurality of arms is called a head stack assembly.

FIG. 13 illustrates an example of a head arm assembly. In this assembly, head gimbal assembly 220 is attached to one end of arm 230. Coil 231 which constitutes part of the voice coil motor is attached to the other end of arm 230. In the intermediate portion of arm 230, bearing section 233 is provided which is attached to shaft 234 that rotatably holds arm 230.

Figure 14:
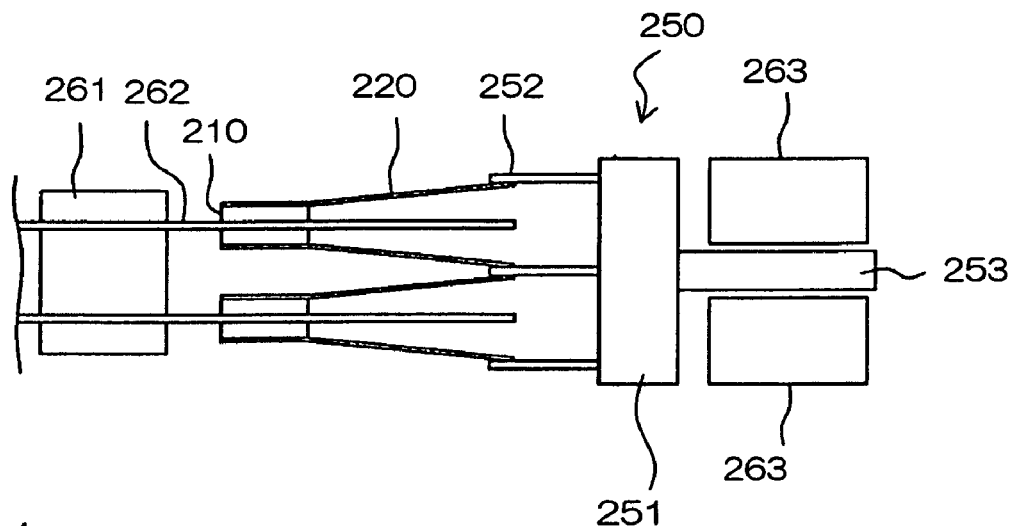
FIG. 14 is an explanatory diagram illustrating the essential part of a hard disk drive which incorporates thin-film magnetic heads according to the present invention.
Figure 15:
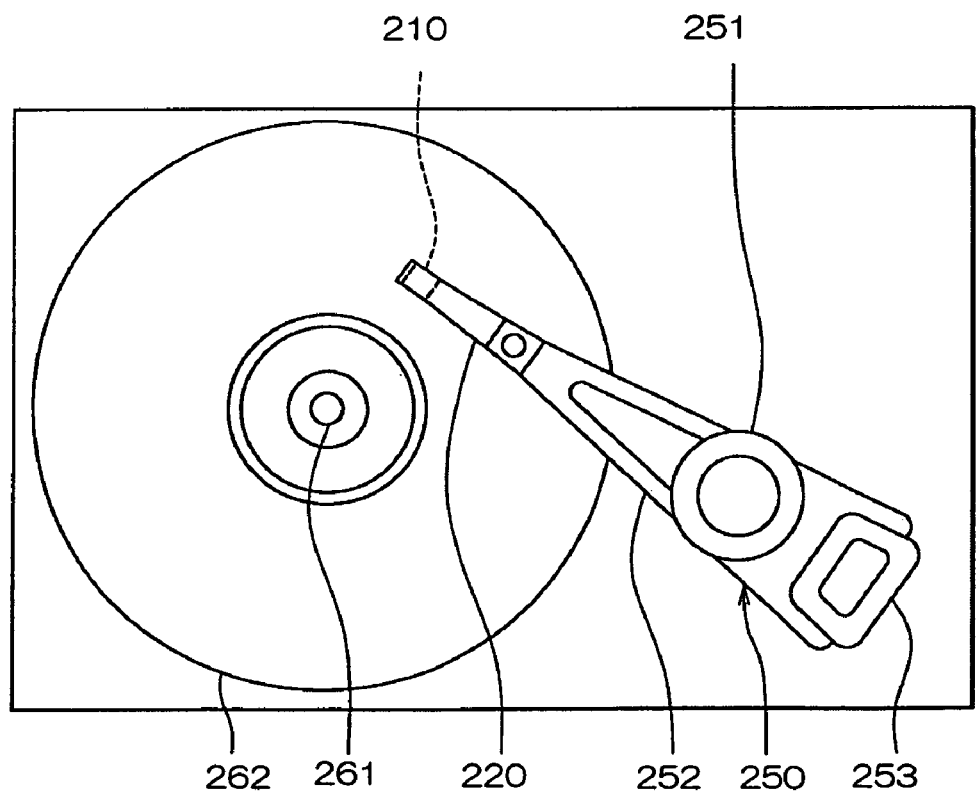
FIG. 15 is a plan view of a hard disk drive which incorporates thin-film magnetic heads according to the present invention.

Referring to FIG. 14 and FIG. 15, a head stack assembly and a hard disk drive that use CPP element 2 as a head element will be explained next. FIG. 14 is an explanatory diagram illustrating an essential part of a hard disk drive, and FIG. 15 is a plan view of the hard disk drive. Head stack assembly 250 has carriage 251 provided with a plurality of arms 252. A plurality of head gimbal assemblies 220 are attached to a plurality of arms 252 such that head gimbal assemblies 220 are located apart from each other in the vertical direction. Coil 253 which constitutes part of the voice coil is attached to carriage 251 on the side opposite to arms 252. Head stack assembly 250 is installed in the hard disk drive which has a plurality of hard disks connected to spindle motor 261. Two sliders 210 are arranged per each hard disk 262 at positions opposite to each other interposing hard disk 262 therebetween. The voice coil motor has permanent magnets 263 which are arranged in positions opposite to each other interposing coil 253 of head stack assembly 250 therebetween.

Head stack assembly 250 and the actuator, except for sliders 210, work as a positioning device. They carry sliders 210 and work to position sliders 210 relative to hard disks 262.

The hard disk drive moves sliders 210 in the transverse direction with regard to the tracks of hard disks 262 by using the actuator, and positions sliders 210 relative to hard disks 262. The thin-film magnetic head 1 contained in slider 210 records information to hard disk 262 by using a write head, and reads information recorded in hard disk 262 by using a read head that uses CPP element 2 as a head element.

While the preferred embodiment of the present invention has been presented and described in detail, it should be understood that a variety of alterations and modifications can be made without departing from the spirit or scope of the appended claims.

What is claimed is:

1. A magneto-resistive effect element comprising:
    a free layer having a magnetization direction which varies with respect to an external magnetic field;
    a pinned layer which includes a stacked structure comprising an outer pinned layer which has a magnetization direction that is fixed with respect to the external magnetic field, a non-magnetic intermediate layer comprising ruthenium, and an inner pinned layer with a thickness of 3 nm or more, wherein the inner pinned layer has a magnetization direction which is fixed with respect to the external magnetic field due to anti-ferromagnetic coupling with the outer pinned layer via the non-magnetic intermediate layer;
    a spacer layer sandwiched between the free layer and the inner pinned layer; and
    an anti-ferromagnetic layer comprising an iridium manganese alloy which is in contact with a surface of the pinned layer opposite to the free layer, and which fixes the magnetization direction of the outer pinned layer with respect to the external magnetic field by exchange coupling with the outer pinned layer,
    wherein the outer pinned layer and the inner pinned layer comprise a cobalt iron alloy, and
    wherein an atomic percent of cobalt in the outer pinned layer increases from a boundary between the outer pinned layer and the anti-ferromagnetic layer toward a boundary between the outer pinned layer and the non-magnetic intermediate layer, and an atom it percent of cobalt in the inner pinned layer decreases from a boundary between the inner pinned layer and the non-magnetic intermediate layer toward a boundary between the inner pinned layer and the spacer layer.

2. The magneto-resistive effect element according to claim 1, wherein the outer pinned layer comprises an anti-ferromagnetic layer contacting layer which is in contact with the anti-ferromagnetic layer, and
    wherein the anti-ferromagnetic layer contacting layer comprises a cobalt iron alloy having atomic percent of cobalt that ranges from 65% to 75%.

3. The magneto-resistive effect element according to claim 2, wherein the anti-ferromagnetic layer contacting layer comprises a plurality of layers comprising a cobalt iron alloy, and
    wherein an average atomic percent of cobalt over the plurality of layers ranges from 65% to 75%.

4. The magneto-resistive effect element according to claim 1, wherein the outer pinned layer has an outer non-magnetic intermediate layer contacting layer which is in contact with the non-magnetic intermediate layer, and comprises a cobalt iron alloy having an atomic percent of cobalt that ranges from 70% to 100%, and wherein the inner pinned layer comprises an inner non-magnetic intermediate layer contacting layer which is in contact with the non-magnetic intermediate layer, and comprises a cobalt iron alloy having an atomic percent of cobalt that ranges from 70% to 100%.

5. The magneto-resistive effect element according to claim 4, wherein each atomic percent of cobalt in the outer non-magnetic intermediate layer contacting layer and the inner non-magnetic intermediate layer contacting layer ranges from 90% to 100%.

6. The magneto-resistive effect element according to claim 1, wherein the inner pinned layer comprises a spacer layer contacting layer which is in contact with the spacer layer, and comprises a cobalt iron alloy having an atomic percent of cobalt that ranges from 10% to 70%.

7. The magneto-resistive effect element according to claim 1, wherein the inner pinned layer includes:

an inner non-magnetic intermediate layer contacting layer which is in contact with the non-magnetic intermediate layer, and comprises cobalt iron alloy having an atomic percent of cobalt that ranges from 70% to 100%;

a spacer layer contacting layer which is in contact with the spacer layer, and comprises a cobalt iron alloy having an atomic percent of cobalt that ranges from 10% to 70%; and a cobalt iron alloy intermediate layer which is interposed between the inner non-magnetic intermediate layer contacting layer and the spacer layer contacting layer, wherein the cobalt iron alloy intermediate layer has two to five copper layers inserted therein being located apart from each other, and the cobalt iron alloy intermediate layer includes an atomic percent of cobalt ranging from 10% to 70%.

8. A thin-film magnetic head for reading data recorded on a recording medium comprising the magneto-resistive effect element according to claim 1, wherein the thin-film magnetic head is arranged on an air bearing surface.

9. A head gimbal assembly comprising:

a slider which includes the thin-film magnetic head according to claim 8, and which is arranged opposite to the recording medium; and a suspension for resiliently supporting the slider.

10. A hard disk drive comprising:

a slider which includes the thin-film magnetic head according to claim 8, and which is arranged opposite to the recording medium that is rotarily-driven; and a positioning device for supporting the slider and for positioning the slider relative to the recording medium.

11. The magneto-resistive effect element according to claim 1, wherein a sense current flows through the pinned layer, the spacer layer, and the free layer substantially in a stacked direction.

12. The magneto-resistive effect element according to claim 1, wherein said outer pinned layer comprises:

a first cobalt iron alloy layer formed at said boundary with said anti-ferromagnetic layer; and a second cobalt iron alloy layer formed at said boundary with said non-magnetic intermediate layer, and having an atomic percent of cobalt which is greater than an atomic percent of cobalt in said first cobalt iron alloy layer.

13. The magneto-resistive effect element according to claim 1, wherein said inner pinned layer comprises plural cobalt iron alloy layers and plural Cu layers.

14. The magneto-resistive effect element according to claim 1, wherein said inner pinned layer comprises:

a first cobalt iron alloy layer formed at said boundary with said non-magnetic intermediate layer; and a second cobalt iron alloy layer formed at said boundary with said spacer layer, and having an atomic percent of cobalt which is less than an atomic percent of cobalt in said first cobalt iron alloy layer.

15. A pinned layer formed between an anti-ferromagnetic layer and a spacer layer of a magneto-resistive effect element said pinned layer comprising:

an outer pinned layer comprising a cobalt iron alloy and having a magnetization direction that is fixed with respect to an external magnetic field;

a non-magnetic intermediate layer comprising ruthenium; and an inner pinned layer comprising a cobalt iron alloy and having a magnetization direction which is fixed with respect to the external magnetic field, wherein an atomic percent of cobalt in the outer pinned layer increases from a boundary between the outer pinned layer and the anti-ferromagnetic layer toward a boundary between the outer pinned layer and the non-magnetic intermediate layer, and an atomic percent of cobalt in the inner pinned layer decreases from a boundary between the inner pinned layer and the non-magnetic intermediate layer toward a boundary between the inner pinned layer and the spacer layer.

16. The pinned layer according to claim 15, wherein said magneto-resistive effect element further comprises a free layer having a magnetization direction which varies with respect to an external magnetic field, wherein said spacer layer is sandwiched between the free layer and the inner pinned layer, and wherein said anti-ferromagnetic layer comprises an iridium manganese alloy which is in contact with a surface of the pinned layer opposite to the free layer, and fixes the magnetization direction of the outer pinned layer with respect to the external magnetic field by exchange coupling with the outer pinned layer.

* * * * *